(12) United States Patent
Cooke et al.

(10) Patent No.: US 7,839,054 B2
(45) Date of Patent: Nov. 23, 2010

(54) PIEZOELECTRIC ACTUATOR

(75) Inventors: Michael P. Cooke, Kent (GB);
Christopher A. Goat, Kent (GB);
Simon R. Panteny, Kent (GB); Gordon M. Reid, Kent (GB)

(73) Assignee: Delphi Technologies Holding S.arl, Troy, MI (US)

( * ) Notice: Subject to any disclaimer, the term of this patent is extended or adjusted under 35 U.S.C. 154(b) by 0 days.

(21) Appl. No.: 11/724,457

(22) Filed: Mar. 15, 2007

(65) Prior Publication Data
US 2007/0216265 A1  Sep. 20, 2007

(51) Int. Cl.
*H01L 41/08* (2006.01)
(52) U.S. Cl. .................................. 310/328; 310/366
(58) Field of Classification Search ............... 310/328, 310/366
See application file for complete search history.

(56) References Cited

U.S. PATENT DOCUMENTS

| | | | |
|---|---|---|---|
| 5,844,349 A | 12/1998 | Oakley et al. | |
| 6,104,129 A * | 8/2000 | Okamoto | 310/366 |
| 6,822,374 B1 | 11/2004 | Smith et al. | |
| 2002/0149296 A1 | 10/2002 | Fujii et al. | |
| 2006/0043842 A1 * | 3/2006 | Iwase et al. | 310/344 |

FOREIGN PATENT DOCUMENTS

| | | |
|---|---|---|
| DE | 102005034904 | 2/2006 |
| GB | 2258084 | 1/1993 |
| JP | 62239588 | 10/1987 |
| JP | 63084175 | 4/1988 |
| JP | 02 203578 | 8/1990 |
| JP | 03156986 | 7/1991 |
| JP | 03185884 | 8/1991 |
| JP | 07074410 | 3/1995 |
| JP | 09153649 | 6/1997 |
| JP | 2004 063886 | 2/2004 |

* cited by examiner

*Primary Examiner*—Mark Budd
(74) *Attorney, Agent, or Firm*—Thomas N. Twomey (57) ABSTRACT

A piezoelectric actuator comprising a stack of piezoelectric layers formed from a piezoelectric material, a plurality of internal electrodes disposed throughout the stack to define active regions of the piezoelectric material therebetween which are responsive to a voltage applied across two or more groups of the internal electrodes in use, an insulating arrangement which at least partially covers at least one surface of the stack to define a piezoelectric/insulator interface, and two or more side electrodes to connect with the two or more groups of the internal electrodes. At least one bridging arrangement extends through the insulating arrangement and comprises a conductive material, so as to provide a connection between a side electrode and an internal electrode, wherein at least one first surface, defined by an interface between the conductive material and the insulating arrangement, and at least one second surface, defined by an internal boundary of a piezoelectric layer, are substantially continuous with one another in the vicinity of the piezoelectric/insulator interface.

12 Claims, 10 Drawing Sheets

PIEZOELECTRIC ACTUATOR

This invention relates to a piezoelectric actuator, suitable for use in a fuel injector in an internal combustion engine. In particular, the invention relates to the connections between the electrodes of the actuator.

Figures 1, 2, 3:
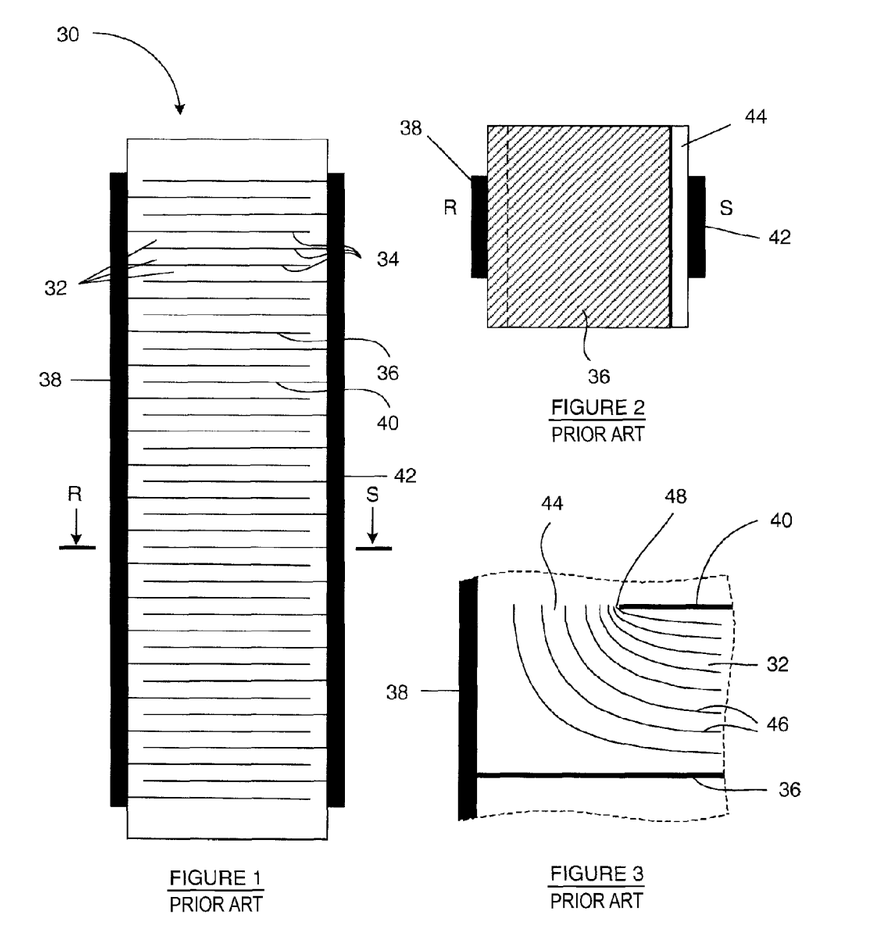
FIG. 1, which is a sectional drawing of a known piezoelectric actuator.
FIG. 2, which is a cross-section on R-S of the actuator of FIG. 1.
FIG. 3, which is a sectional drawing showing equipotential lines in part of the actuator of FIGS. 1 and 2, in use.

Referring to FIG. 1 of the accompanying drawings, a known piezoelectric actuator 30 has a stack structure formed from an alternating sequence of piezoelectric layers 32 and planar internal electrodes 34. The piezoelectric layers 32, in turn, form an alternating sequence of oppositely polarised layers, and the internal electrodes 34 form an alternating sequence of positive and negative internal electrodes. The positive internal electrodes, one of which is indicated at 36, are in electrical connection with a first external electrode, referred to as the positive side electrode 38. Likewise, the negative internal electrodes, one of which is indicated at 40, are in electrical connection with a second external electrode, referred to as the negative side electrode 42. Typically, each internal electrode 36, 40 is approximately 2 µm thick, and each piezoelectric layer 32 is around 100 µm thick. The stack may comprise of the order of 1000 such piezoelectric layers.

FIG. 2 of the accompanying drawings shows a cross section of the actuator 30 of FIG. 1 coplanar with a positive internal electrode 36. An edge of the positive internal electrode 36 connects with the positive side electrode 38. However, the positive internal electrode 36 extends only partially across the stack, to define an insulating region 44 between the edge of the positive internal electrode 36 and the negative side electrode 42 so that the positive internal electrode 36 is electrically isolated from the negative side electrode 42. In a similar manner, each of the other positive internal electrodes 36 defines an insulating region between its edge and the negative side electrode 42. Likewise, each of the negative internal electrodes 40 (not shown in FIG. 2) defines an insulating region between its edge and the positive side electrode 38.

If a voltage is applied between the two side electrodes 38, 42, the resulting electric fields between each pair of adjacent positive and negative internal electrodes 36, 40 cause each piezoelectric layer 32 to undergo a change in thickness and, therefore, the piezoelectric stack undergoes a strain along its length, i.e. along an axis normal to the plane of each internal electrode 36, 40. Because of the polarisation of the piezoelectric layers 32, it follows that, not only can the magnitude of the strain be controlled by adjusting the applied voltage, but also the direction of the strain can be reversed by switching the polarity of the applied voltage. Rapidly varying the magnitude and/or polarity of the applied voltage causes rapid changes in the strength and/or direction of the electric fields across the piezoelectric layers 32, and consequentially rapid variations in the length of the piezoelectric actuator 30. Typically, the piezoelectric layers 32 of the stack are formed from a ferroelectric material with high permittivity, such as lead zirconate titanate.

Such an actuator is suitable for use in a fuel injector, for example of the type known from the present Applicant's European Patent No. EP 0995901 B. The fuel injector is arranged so that a change in the length of the actuator results in a movement of a valve needle. The needle can be thus raised from or lowered onto a valve seat by control of the actuator length so as to permit a quantity of fuel to pass, through drillings provided in the valve seat, into the associated engine.

To achieve good control of the valve needle, it is desirable that the available change in length of the actuator is as large as possible. For a given piezoelectric material and actuator construction, the change in actuator length that occurs when a voltage is applied between the two electrodes depends on the number of piezoelectric layers provided, i.e. the length of the stack, and the magnitude of the applied voltage. Increasing either of these parameters results in a larger length change. It is often impractical to increase the length of the stack, since the space within a fuel injector in which the actuator can be accommodated is restricted. Therefore, it is desirable that high voltages can be repeatedly applied to an actuator. However, driving an actuator with a high voltage reduces its reliability, as will now be discussed.

When a voltage is applied between the positive and negative internal electrodes 36, 40, by way of the side electrodes 38, 42, an electric field is set up between the internal electrodes 36, 40, and within the piezoelectric layers 32. The strength and direction of the electric field in part of the actuator of FIG. 1 is represented in FIG. 3 of the accompanying drawings by equipotential contours, two of which are indicated at 46. Each equipotential contour 46 describes a locus of constant electrical potential.

Close to the edge 48 of the negative internal electrode 40, the local strength of the electric field in the piezoelectric material is much higher than, for example, the average electric field in the region between the internal electrodes 36, 40. This increased local electric field, or electric field concentration, is indicated by the close spacing of the equipotential contours 46 close to the electrode edge 48 in FIG. 3. The piezoelectric material in the insulating region 44 responds piezoelectrically to this high strength electric field and, as a consequence, large mechanical stresses, or stress concentrations, are generated in the piezoelectric material. This situation occurs in the insulating regions at the edge of each internal electrode 36, 40, irrespective of its polarity.

The high electric field strength and concentration of stress in and close to the insulating regions 44 can cause short circuit failures. For example, the electric field strength may locally exceed the dielectric breakdown strength of the piezoelectric material, causing arcing between the internal electrodes 36, 40. Furthermore, the stress concentration can cause cracking of the layers 32 and the internal electrodes 36, 40, and can give rise to failure at the interfaces between the internal electrodes 36, 40 and the layers 32. The cracks act as regions of reduced dielectric strength, so that if cracks form between the internal electrodes 36, 40, the likelihood of arcing through the cracks is increased. When arcing occurs, the resulting temperature increase can cause melting or vaporisation of the material adjacent to the cracks. These and similar events at least reduce the ability of the actuator 30 to respond in the desired way to an applied voltage and, in many cases, the actuator completely fails.

Figure 4:
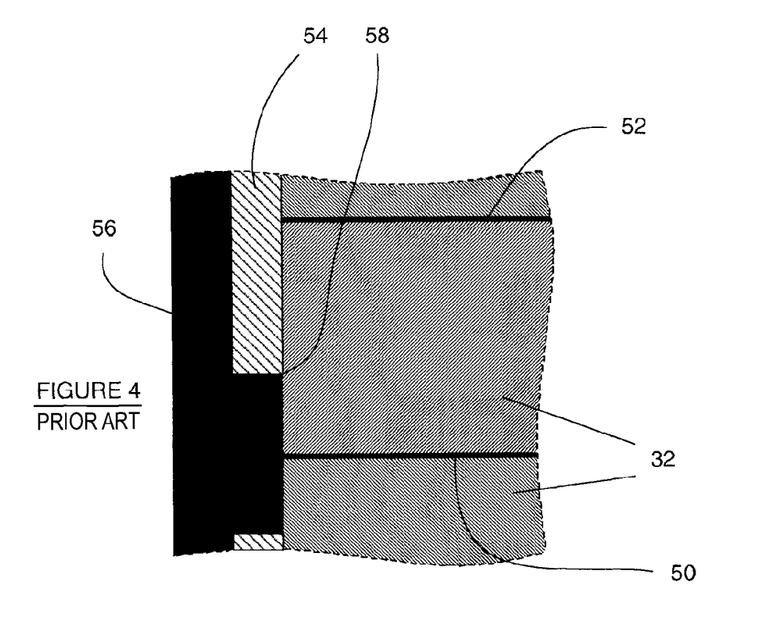
FIG. 4, which is a sectional drawing of part of a second known piezoelectric actuator.

An alternative actuator construction, known for example from Japanese Patent Application No. JP 2002118305 A and Japanese Patent Application No. JP 2000270568 A, and shown in part in FIG. 4 of the accompanying drawings, differs from that described above in that the piezoelectric layers 32 are separated by positive and negative internal electrodes 50, 52 which extend to the periphery of the stack. Positive internal electrodes 50 and negative internal electrodes 52 are arranged either side of each piezoelectric layer 32. Insulating regions 54 are carried on a first face of the stack and cover part of the surface of the stack. The stack and insulating regions 54 together carry a positive side electrode 56. The positive side electrode 56 is in electrical contact with the positive internal electrodes 50, but the insulating regions 54 separate the positive side electrode 56 from the negative internal electrodes 52, and hence prevent electrical conduction between the positive side electrode 56 and the negative internal electrodes 52.

A complementary arrangement exists on a second, opposite face of the stack, where a negative side electrode (not shown) is applied to the stack surface so as to be in electrical contact with the negative internal electrodes 52. Insulating regions prevent electrical contact between the positive internal electrodes 50 and the negative side electrode. Each internal electrode of a given polarity is therefore in electrical contact with the side electrode of like polarity and insulated from the side electrode of opposite polarity.

Figure 5:
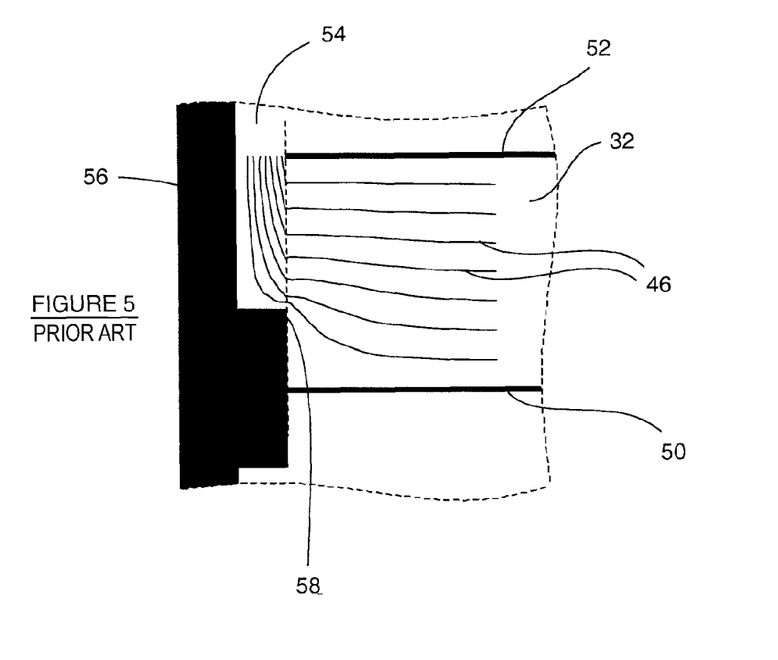
FIG. 5, which is a sectional drawing similar to that of FIG. 4, showing equipotential lines in the second known actuator, in use.

The actuator construction of FIG. 4 is beneficial in that the actuator stack can be manufactured with internal electrodes that have the same in-plane shape as the piezoelectric layers, eliminating the requirement to provide insulating regions within the stack structure such as that indicated at 44 in FIG. 2. However, when a voltage is applied between the side electrodes, an electric field concentration develops in the vicinity of the corner 58 formed between a side electrode face adjacent to the stack and a side electrode face adjacent to the insulating region 54. This is indicated by the close spacing of the equipotential contours 46 close to the corner 58 in FIG. 5 of the accompanying drawings. The high strength electric field exists in both the insulating regions 54 and the piezoelectric layers 32, and gives rise to the problems of dielectric breakdown and cracking described above, reducing the reliability of such a stack.

It is an aim of the present invention to provide a piezoelectric actuator that alleviates or overcomes the abovementioned problems.

Against this background, there is provided a piezoelectric actuator comprising a stack of piezoelectric layers formed from a piezoelectric material, a plurality of internal electrodes disposed throughout the stack to define active regions of the piezoelectric material therebetween which are responsive to a voltage applied across two or more groups of the internal electrodes in use, an insulating arrangement or means which at least partially covers at least one surface of the stack to define a piezoelectric/insulator interface, and two or more side electrodes to connect with the two or more groups of the internal electrodes, characterised in that at least one bridging arrangement or means extends through the insulating means, the bridging means comprising a conductive material so as to provide a connection between a side electrode and an internal electrode, wherein at least one first surface, defined by an interface between the conductive material and the insulating means, and at least one second surface, defined by an internal boundary of a piezoelectric layer, are substantially continuous with one another in the vicinity of the piezoelectric/insulator interface.

The internal boundary of a piezoelectric layer which defines the second surface is an interface between the piezoelectric material and the conductive material, or an interface between the piezoelectric material and the internal electrode.

The first and second surfaces are substantially continuous so that a surface defined by the first and second surfaces together is smooth in the vicinity of the piezoelectric/insulator interface. Here, smooth refers to the macroscopic shape of the surfaces, rather than their microscopic topography. For example, the first and second surfaces may share a common tangent at the piezoelectric/insulator interface. As a further example, there may be no significant step between the first and second surfaces at the piezoelectric/insulator interface, where a significant step could be considered to have a height of around 20% or more of the spacing between the internal electrodes.

Such an actuator is advantageous because, when a voltage is applied across the side electrodes to energise the stack, the electric field that arises in the piezoelectric layers and in the insulating means is not significantly concentrated at the ends of the internal electrodes because the change in permittivity at the interface between the piezoelectric material of the stack and the insulating means causes the electric field in the piezoelectric material to dominate over the electric field in the insulating material. The actuator is therefore less susceptible to the types of failure associated with high local electric fields and stress concentrations as seen in conventional actuators.

The size of the region over which the first and second surfaces are substantially continuous, referred to as the vicinity of the piezoelectric/insulator interface, is not critical to the invention, as some benefit is achieved when the first and second surfaces are substantially continuous only over a small region close to the piezoelectric/insulator interface. For example, the first and second surfaces could be substantially continuous over a region at the piezoelectric/insulator interface with a width 2% or less of the spacing between the internal electrodes. However, the first and second surfaces could be substantially continuous over an appreciably larger region.

The insulating material has a low relative permittivity. Preferably, the relative permittivity of the insulating material is several orders of magnitude below that of the piezoelectric material. For example, the relative permittivity of the insulating material may be around 30, whereas the relative permittivity of a piezoelectric material such as lead zirconate titanate (PZT) is typically between 1000 and 10000. However, the benefit of the invention is still realised when the relative permittivity of the insulating material is, for example, 25% of the relative permittivity of the piezoelectric material. The insulating material does not show significant piezoelectric activity in comparison to the piezoelectric material. Furthermore, the insulating material preferably has a high dielectric strength, for example greater than 2 MV m$^{-1}$.

The actuator of the present invention is intended for applications which require a relatively large bi-directional displacement of the actuator. To this end, the term 'piezoelectric material' as used in this specification refers to materials having a relatively high piezoelectric coefficient, such as PZT, and which are generally recognised in the art as being piezoelectric materials suitable for use in actuator applications. It will be appreciated that electrostrictive materials which are not piezoelectric are not considered suitable for the actuator of the present invention, because they give rise to much smaller displacements than piezoelectric materials. For this reason, the problems of stress concentrations at the ends of the internal electrodes in actuators made from electrostrictive, non-piezoelectric materials are in any case much less significant than in piezoelectric actuators.

Most preferably, the first and second surfaces intersect the plane of the piezoelectric/insulator interface at a perpendicular angle. However, the benefits of the invention are still substantially retained if the first and second surfaces intersect the plane of the piezoelectric/insulator interface at an oblique angle.

Preferably, a midplane of the or each bridging means is aligned with respect to a midplane of the or each internal electrode. However, a midplane of the or each bridging means may be misaligned with respect to a midplane of the or each internal electrode, so that some misalignment of the bridging means with respect to the internal electrodes can be accommodated.

The or each bridging means may traverse the piezoelectric/insulator interface. In one arrangement, the or each bridging means comprises a slot and, in this case, the slot may traverse the piezoelectric/insulator interface and extend into the piezoelectric material.

When the bridging means is a slot, the or each slot may be a groove with parallel sides. Such an arrangement is convenient if the slots are laser cut. Alternatively, the or each slot may be a 'v' shaped groove, which is convenient if the slots are cut by a mechanical cutter. The internal end of the or each slot may be rounded, and/or may be part cylindrical. In another example, the or each slot may have a sharp internal end.

The conductive material of the side electrode may coat the surface of the or each slot. Furthermore, the conductive material of the side electrode may fill the or each slot.

In another embodiment, the or each bridging means comprises an internal electrode which extends through the insulating means. In other words, the internal electrode extends into and traverses the insulating means to connect with the respective side electrode, thus forming the bridging means.

The or each bridging means may instead comprise an internal electrode which extends into but not through the insulating means, and a slot in the insulating means which intersects the internal electrode. In this arrangement, therefore, a first part of the or each bridging means comprises a slot which may contain the conductive material of the side electrode or a different conductive material, and a second part of the or each bridging means comprises an extended portion of the internal electrode.

Elegantly, the shape of the or each bridging means is complementary to the shape of the perimeter of the respective internal electrode.

The invention also extends to a method of constructing a piezoelectric actuator comprising a stack of piezoelectric layers formed from a piezoelectric material, an insulating means, and two or more side electrodes. The method comprises forming one or more slots in the insulating means carried on the piezoelectric stack; and applying a conductive material to the insulating means and the or each slot so as to provide a connection between an internal electrode and one of the side electrodes, wherein at least one first surface, defined by an interface between the conductive material and the insulating means, and at least one second surface, defined by an internal boundary of a piezoelectric layer, are substantially continuous with one another in the vicinity of the interface between the piezoelectric material and the insulating means.

Conveniently, the or each slot is formed across the interface between the piezoelectric material of the stack and the insulating means. The conductive material may be coated on the surface of the or each slot. In addition, the conductive material may fill the or each slot.

Reference has already been made to:

The present invention will now be described, by way of example only, with reference to the remaining drawings, in which:

FIG. 18($a$) is a sectional drawing of a seventh embodiment of the present invention, and FIG. 18($b$) is a cross-section on T-U of FIG. 18($a$);

FIG. 19($a$) is a sectional drawing of an eighth embodiment of the present invention, and FIG. 19($b$) is a cross-section on V-W of FIG. 19($a$);

Figure 6:
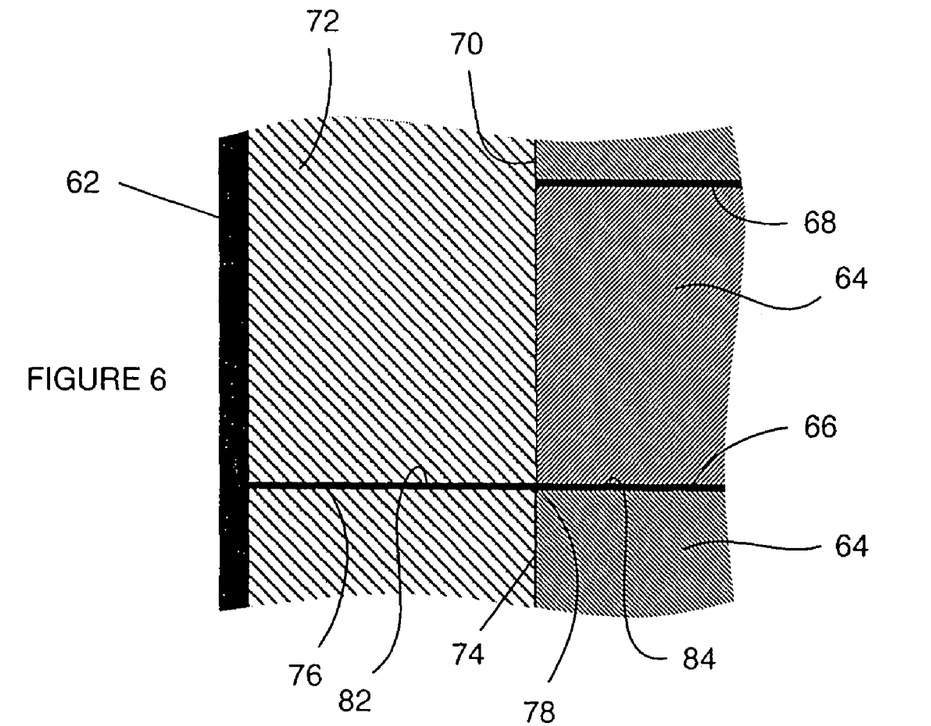
FIG. 6 is a sectional drawing of part of an actuator according to a first embodiment of the present invention.

According to a first embodiment of the present invention, there is provided a piezoelectric actuator, part of which is shown in FIG. 6, comprising a piezoelectric stack, an insulating arrangement or means, a positive side electrode 62 and a negative side electrode (not shown).

The stack comprises a plurality of piezoelectric layers 64 formed from a piezoelectric material, and a plurality of planar internal electrodes 66, 68, only two of which are shown in FIG. 6, disposed between the piezoelectric layers 64. The internal electrodes 66, 68 are alternately in electrical connection with the positive side electrode 62 and the negative side electrode.

The internal electrodes in electrical connection with the positive side electrode 62 are referred to as the positive internal electrodes 66. Likewise, the internal electrodes in electrical connection with the negative side electrode are referred to as the negative internal electrodes 68. The stack is therefore a repeating sequence, each repeat comprising: positive internal electrode 66; piezoelectric layer 64; negative internal electrode 68; and piezoelectric layer 64.

The periphery of the stack defines a cuboid, having two square end faces (not shown) parallel to the planes of the internal electrodes 66, 68, and four rectangular side faces containing directions parallel to the long axis of the stack. One of the rectangular side faces (the positive face 70) carries the positive side electrode 62 and the opposed rectangular side face (the negative face, not shown) carries the negative side electrode.

The insulating means comprises a coating 72 of insulating material carried on the side faces of the stack to define a piezoelectric/insulator interface 74 along the long axis of the stack between the insulating coating 72 and the piezoelectric layers 64. The insulating material has a low permittivity and has a low piezoelectric response.

The insulating coating 72 is interrupted by bridging arrangement or means comprising slots 76 (only one of which is shown in FIG. 6), each of which extends through the insulating coating 72 to the piezoelectric/insulator interface 74. The slots 76 are parallel-sided grooves of the same thickness as the internal electrodes 66, 68. The internal end 78 of each slot is flat and lies at the plane of the piezoelectric/insulator interface 74. The positions of the slots 76 are such that each internal electrode 66, 68 emerges at the internal end 78 of a respective slot 76.

The slots 76 that intersect the positive internal electrodes 66 traverse the insulating coating 72 carried on the positive face 70 of the stack and are known as the positive slots. Similarly, the slots 76 that intersect the negative internal electrodes 68 traverse the insulating coating 72 carried on the negative face of the stack and are known as the negative slots. The slot 76 indicated in FIG. 6 is a positive slot.

The positive side electrode 62 comprises a conductive material which is carried on the insulating coating 72 on the positive face 70 of the stack. The conductive material also extends into the positive slots 76. The conductive material of the positive side electrode 62 is therefore in electrical contact with the positive internal electrodes 66 emergent at the internal end 78 of the positive slots 76.

Likewise, the negative side electrode comprises a conductive material which is carried on the insulating coating 72 on the negative face of the stack and which extends into the negative slots that traverse the insulating coating 72 on the negative face. The conductive material of the negative side electrode is in electrical contact with the negative internal electrodes 68 emergent at the internal end of the negative slots.

It can be seen in FIG. 6 that an interface between the conductive material in the positive slot 76 and the insulating material of the insulating coating 72 defines a first surface 82. An internal boundary of the piezoelectric layer, adjacent to the internal electrode in this embodiment, defines a second surface 84. These first and second surfaces 82, 84 are substantially continuous with one another in the vicinity of the piezoelectric/insulator interface 74, because the slot 76 has the same thickness as the internal electrodes 66, 68 in this embodiment. In addition, the first and second surfaces 82, 84 lie perpendicular to the plane of the piezoelectric/insulator interface 74 in the vicinity of the piezoelectric/insulator interface 74.

Figure 7:
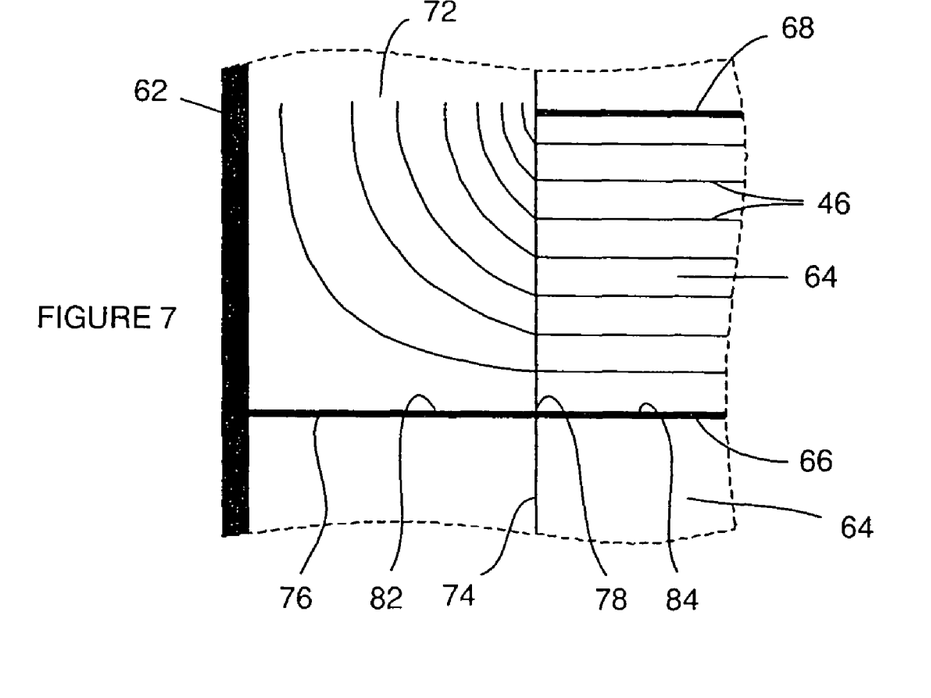
FIG. 7 is a sectional drawing similar to that of FIG. 6, showing equipotential lines in the actuator of the first embodiment, in use.

In use, a voltage is applied across the positive and negative side electrodes of the actuator. As shown in FIG. 7, as a consequence of the applied voltage, an electric field arises in the piezoelectric layers 64 and in the insulating coating 72, in which equipotential lines (two of which are indicated at 46) indicate the strength and direction of the electric field. In this actuator construction, the change in permittivity at the piezoelectric/insulator interface 74 causes the electric field in the piezoelectric material to dominate over the electric field in the insulating coating 72. Therefore, there is no significant concentration of the electric field in the piezoelectric layers 64 close to the periphery of the stack. In addition, the concentration of electric field in the insulating coating 72 is reduced in comparison to the conventional actuators shown in FIGS. 1 to 5. Consequently, there is no significant concentration of stress in the piezoelectric material, and there is less chance of dielectric breakdown due to the lower local electric field strengths. The actuator of FIGS. 6 and 7 therefore offers much improved reliability over existing actuators.

Alternative embodiments of the invention will now be described, like features of each embodiment having like reference numerals in the accompanying drawings.

Figure 8:
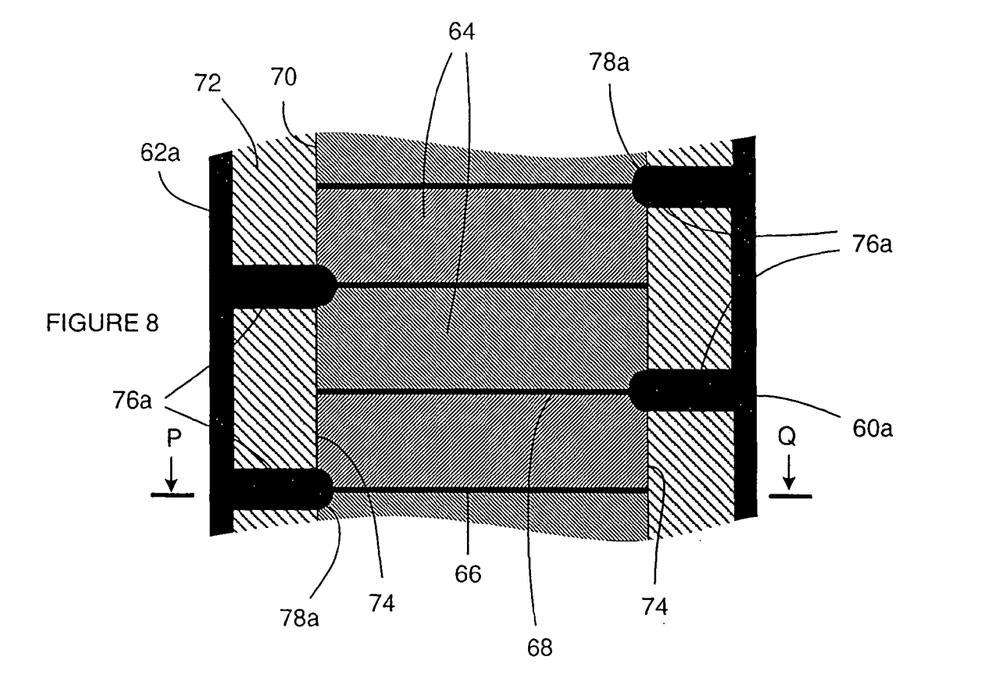
FIG. 8 is a sectional drawing of part of an actuator according to a second embodiment of the present invention.
Figure 9:
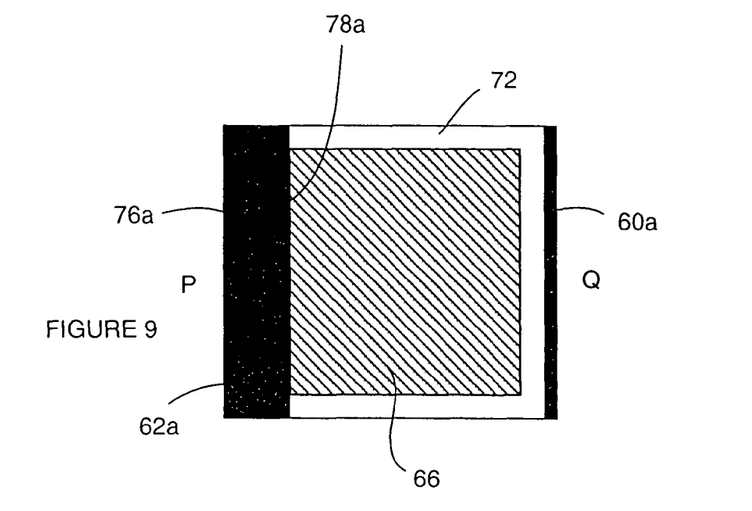
FIG. 9 is a cross-section on P-Q of the actuator of FIG. 8.
Figure 10:
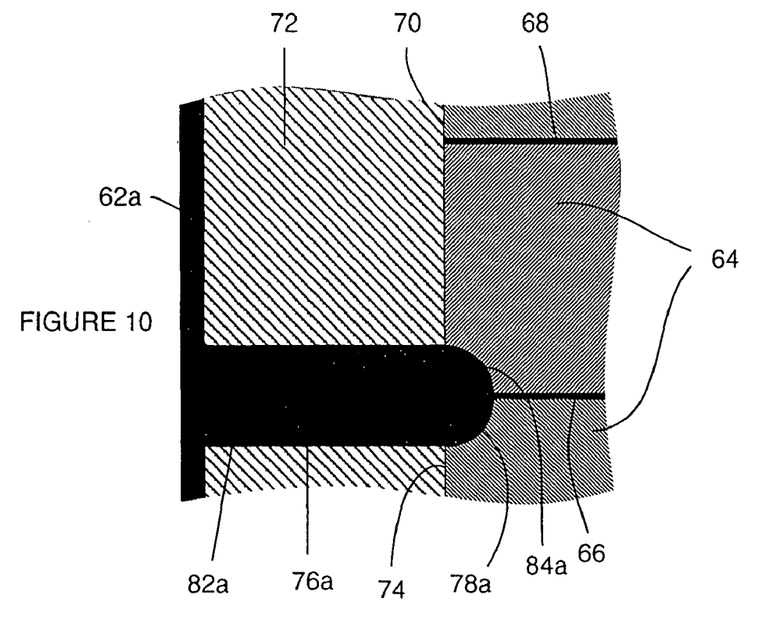
FIG. 10 is a larger scale sectional drawing of part of the actuator of FIGS. 8 and 9.

Referring to FIGS. 8 to 10, according to a second embodiment of the present invention, there is provided a piezoelectric actuator having similar features as the actuator of the first embodiment, except in the arrangement of the connection between the positive and negative side electrodes and the respective positive and negative internal electrodes 66, 68.

Considering the arrangement at the positive face of the stack 70, as shown most clearly in FIG. 10, the insulating coating 72 is interrupted by slots 76a, which extend through the insulating coating 72 to make contact with a respective one of the internal electrodes 66, 68. The slots 76a traverse the piezoelectric/insulator boundary 74 so that the ends of the slots lie within the periphery of the stack. The slots 76a are parallel-sided grooves. The internal end 78a of each slot, located within the periphery of the stack, is rounded to define a part-cylindrical shape with a cylinder axis normal to the plane of the drawing of FIG. 10.

The positions of the slots 76a are such that each slot 76a traverses the piezoelectric/insulator boundary 74 in the vicinity of an internal electrode 66, 68. Each slot 76a intersects and connects with an internal electrode 66, 68, so that, as can be seen in FIG. 8 in particular, each internal electrode 66, 68 emerges at an internal surface of a respective slot 76a.

The positive side electrode 62a comprises a conductive material, carried on the insulating coating 72 adjoining the positive face 70 of the stack, and extending into the positive slots 76a traversing the positive face 70 of the stack. The conductive material of the positive side electrode 62a is in electrical contact with the positive internal electrodes 66 emergent at the internal end 78a of the positive slots 76a.

Likewise, the negative side electrode 60a comprises a conductive material, carried on the insulating coating 72 adjoining the negative face of the stack, and extending into the negative slots 76a traversing the negative face of the stack. The conductive material of the negative side electrode 60a is in electrical contact with the negative internal electrodes 68 emergent at the internal end 78a of the negative slots 76a.

As in the first embodiment, considering the positive face of the stack and referring in particular to FIG. 10, an interface between the conductive material in the slot and the insulating material of the insulating coating defines a first surface 82a. An internal boundary of the piezoelectric layer, adjacent to the conductive material in this embodiment, defines a second surface 84a. These first and second surfaces 82a, 84a are substantially continuous with one another in the vicinity of the piezoelectric/insulator interface 74, because the sides of the slots 76a are straight. In addition, the first and second surfaces 82a, 84a lie perpendicular to the plane of the piezoelectric/insulator interface 74 in the vicinity of the interface 74. The first surface 82a and the second surface 84a therefore together define an internal surface of the slot 76a, the internal surface being smooth in the vicinity of the piezoelectric/insulator interface 74 and lying perpendicular to the plane of the interface 74.

Figure 11:
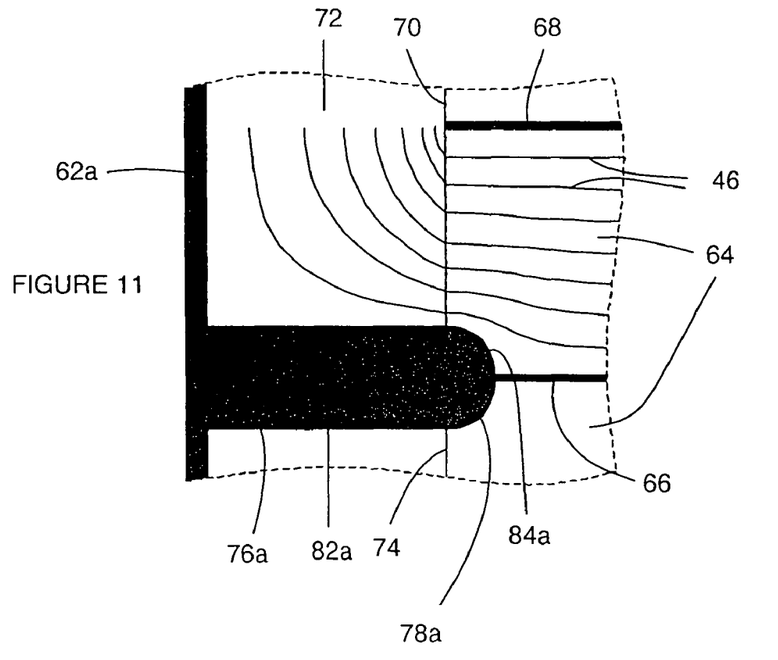
FIG. 11 is a sectional drawing similar to that of FIG. 10, showing equipotential lines in the actuator of the second embodiment, in use.

In use, the side electrodes 60a, 62a are in electrical connection with a variable voltage power supply. When a voltage is applied between the positive and negative side electrodes 60a, 62a, electric fields are generated within the piezoelectric layers 64. As indicated by the equipotential lines in FIG. 11 (two of which are indicated at 46), the strength of the electric field is not significantly higher in the vicinity of the edge of each layer 64 (i.e. at the periphery of the stack) or in the insulating coating 72 than in the layers 64 away from the periphery of the stack. As a consequence, no significant stress concentrations arise in the piezoelectric layers 64, and the risk of failure of the actuator is lower than in the known actuator types of FIGS. 1 to 5.

Figure 12:
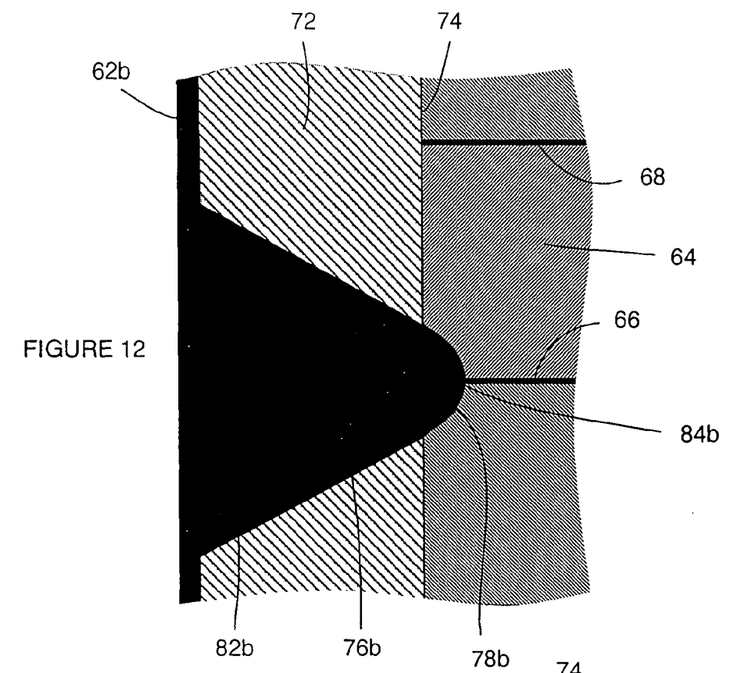
FIG. 12 is a sectional drawing of part of an actuator according to a third embodiment of the present invention.

FIG. 12 shows a third embodiment of the present invention, comprising a piezoelectric actuator similar to the actuator of the second embodiment, except in that each slot 76b has a 'v'-shaped cross section with a rounded internal end 78b.

The positive slots 76b are filled with the conductive material of the positive side electrode 62b. Likewise, the negative slots are filled with the conductive material of the negative side electrode (not shown).

The shape of each slot is such that the previously defined first and second surfaces 82b, 84b are substantially continuous with one another in the vicinity of the piezoelectric/insulator interface 74, because the sides of the slots 76b are straight. The first surface 82b and the second surface 84b together therefore define an internal surface of the slot 76b which is smooth in the vicinity of the piezoelectric/insulator interface 74. In this embodiment, however, the internal surface of the slot 76b is not perpendicular to the piezoelectric/insulator interface 74, but rather the internal surface of the slot 76b meets the piezoelectric/insulator interface 74 at an oblique angle.

Figure 13:
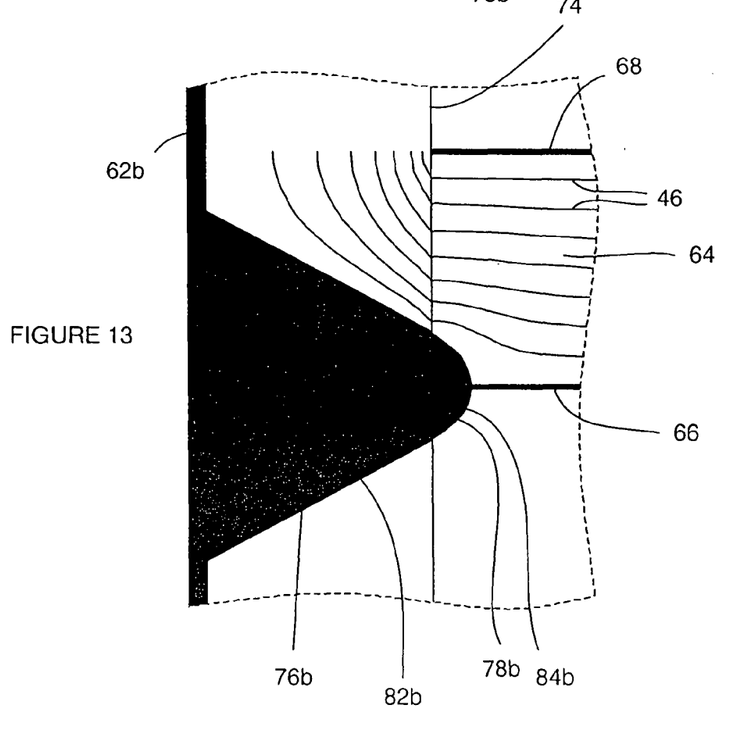
FIG. 13 is a sectional drawing similar to that of FIG. 12, showing equipotential lines in the actuator of the third embodiment, in use.

When a voltage is applied across the side electrodes of the actuator of the third embodiment, in use, an electric field is generated within the piezoelectric layers 64 and the insulating coating as previously described. The strength of the electric field, indicated by the spacing of the equipotential lines 46 in FIG. 13, is again not significantly increased close to the periphery of the stack or in the insulating coating.

Figure 14:
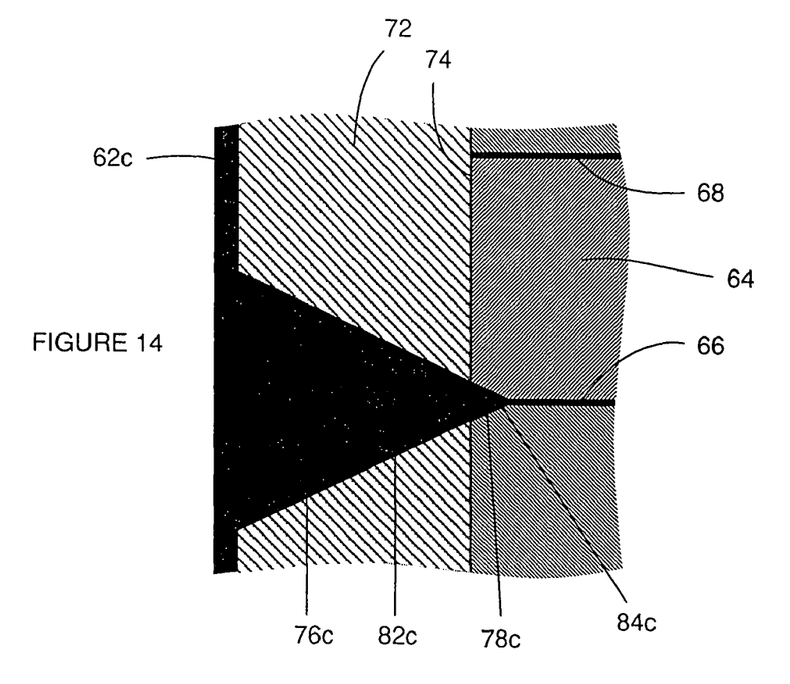
FIG. 14 is a sectional drawing of part of an actuator according to a fourth embodiment of the present invention.

FIG. 14 shows a fourth embodiment of the present invention, comprising a piezoelectric actuator similar to the third embodiment, except in that each slot 76c has a 'v' shaped cross section with a sharp internal end 78c.

The shape of each slot is such that the previously defined first and second surfaces 82c, 84c are substantially continuous with one another in the vicinity of the piezoelectric/insulator interface 74, because the sides of the slots 76c are straight. The first surface 82c and the second surface 84c therefore together define an internal surface of the slot 76c, the internal surface being smooth in the vicinity of the piezoelectric/insulator interface 74. As in the third embodiment, the internal surface of the slot 76c is not perpendicular to the piezoelectric/insulator interface 74, but rather the internal surface of the slot 76c meets the piezoelectric/insulator interface 74 at an oblique angle.

The positive slots 76c are filled with the conductive material of the positive side electrode 62c. Likewise, the negative slots are filled with the conductive material of the negative side electrode (not shown).

Figure 15:
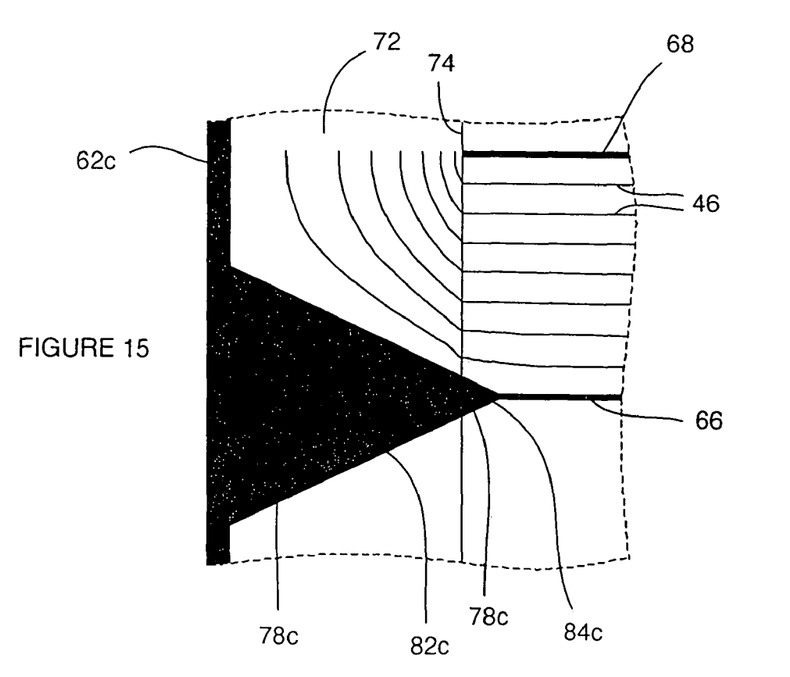
FIG. 15 is a sectional drawing similar to that of FIG. 14, showing equipotential lines in the actuator of the fourth embodiment, in use.

When a voltage is applied across the side electrodes of the actuator of the fourth embodiment, in use, an electric field is generated within the piezoelectric layers and the insulating coating as previously described. The strength of the electric field, indicated by the spacing of the equipotential lines 46 in FIG. 15, is again not significantly increased close to the periphery of the stack or in the insulating coating.

Figure 16:
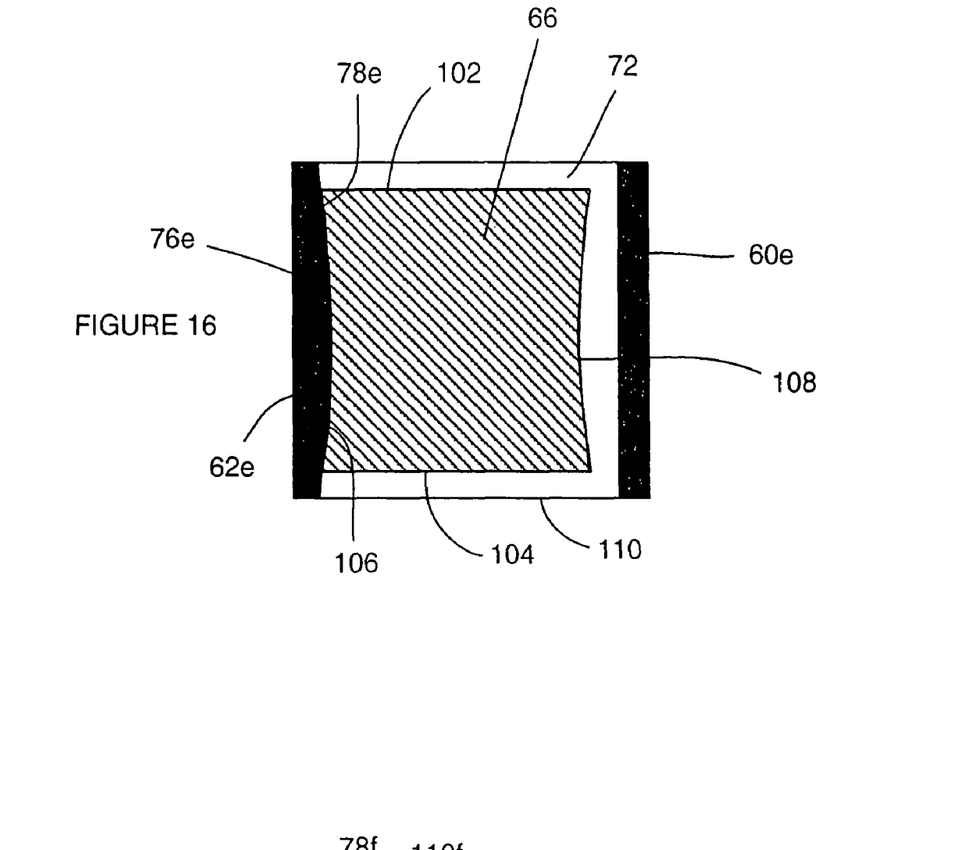
FIG. 16 is a cross-sectional drawing of a fifth embodiment of the present invention.

FIG. 16 shows a fifth embodiment of the present invention, comprising a piezoelectric actuator similar to the actuator of the third embodiment, except in that the stack has a perimeter in cross-section comprising two parallel straight edges 102, 104 to define two planar rectangular side faces (not shown) of the stack, and two parallel concave edges 106, 108 to define two inwardly-curving cylindrically concave side faces (not shown) of the stack. The concave side faces are equivalent to the positive and negative faces of the stack as defined previously, with reference to FIG. 6, and carry the side electrodes 60e, 62e. The insulating coating 72 covers each planar and each concave side face. The outer surface 110 of the insulating coating has a square perimeter in cross-section. The internal end 78e of each of the slots defines a concave arc in the plane of the respective internal electrode, so that the shape of each of the slots 76e is complementary to the shape of the perimeter of the respective internal electrode 66. The arrangement of the fifth embodiment is convenient when the slots are formed by machining with a circular cutter, giving rise to a concave internal end 78e of the slots 76e.

Figure 17:
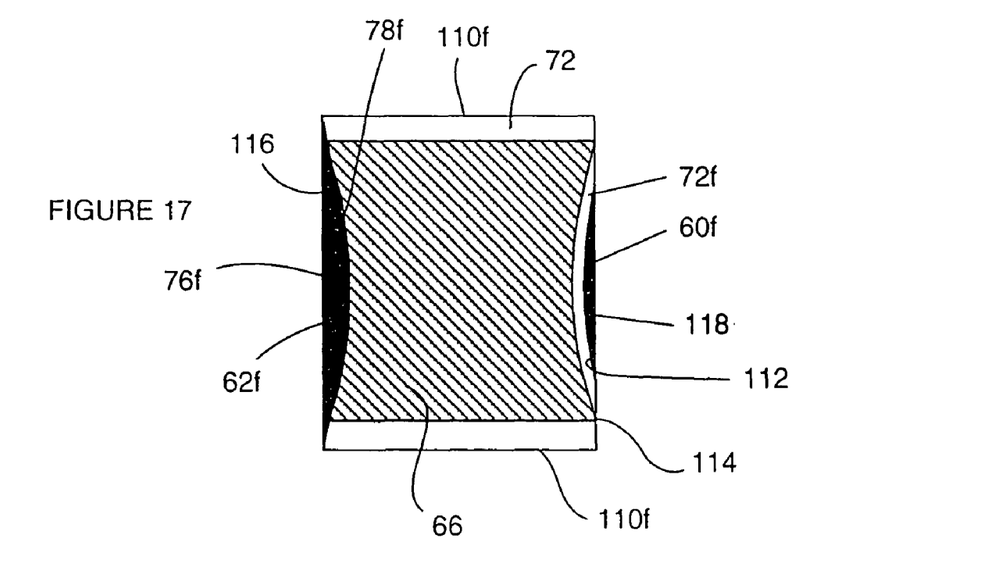
FIG. 17 is a cross-sectional drawing of a sixth embodiment of the present invention.

FIG. 17 shows a sixth embodiment of the present invention, comprising a piezoelectric actuator similar to the actuator of the fifth embodiment, except in that the insulating coating 72f carried on each concave side face of the stack has a constant thickness over the central axial portion of each face, so that the outside surfaces 112 of the insulating coating 72f on these faces are also substantially cylindrically concave. The outside surfaces 110f the insulating coating on the planar side faces of the stack are planar and parallel to one another. Close to the corners 114 between the side faces of the stack, the thickness of the insulating coating on each concave side face decreases, so that the perimeter of the cross-section of the insulating coating lies within a rectangular envelope defined by the planar outside surfaces 110f of the insulating coating.

The side electrodes 60f, 62f carried on the concave faces of the stack, have convex inner surfaces complementary to the concave outer surfaces 112 of the insulating coating. The internal end 78f of each of the slots 76f defines a concave arc in the plane of the respective internal electrodes, so that the shape of each of the slots 76f is complementary to the shape of the perimeter of each of the internal electrodes 66. The outer surface 116, 118 of each of the side electrodes 60f, 62f is planar. Thus, each side electrode 60f, 62f is 'D'-shaped in cross-section and occupies the region between the insulating coating 72f and the rectangular envelope defined by the planar outside surfaces 110f of the insulating coating as well as the region within the slots 62f.

The actuator of the sixth embodiment therefore has a relatively compact arrangement in which the side electrodes 60f, 62f are flush with the periphery of the stack on two faces. Furthermore, the insulating regions 72f between the side electrodes 60f, 62f and the internal electrodes 66, 68 are of substantially constant width. This feature is beneficial because it avoids the presence of relatively thin regions of insulating coating between the side electrodes and the internal electrodes of opposite polarity. Such relatively thin regions could increase the likelihood of premature dielectric breakdown by acting as low-resistance pathways.

FIGS. 18(a) and 18(b) show a seventh embodiment of the present invention, comprising a piezoelectric actuator similar to the fourth embodiment, except in that the spacing between adjacent slots 76g on each side face increases towards the two end faces of the stack 120, 122. Consequently, some internal electrodes 66, 68 are not connected to the side electrode of like polarity 60g, 62g. Two such unconnected internal electrodes are indicated at 124 in FIG. 18(a).

Piezoelectric layers with relatively large thickness and which contain at least one unconnected internal electrode 124 are therefore defined between the connected positive and negative internal electrodes 60g, 62g in the end regions of the stack. These thicker layers undergo a relatively smaller change in thickness upon the application of a voltage between the positive and negative side electrodes 60g, 62g than those thinner layers in the middle region of the stack where no unconnected internal electrodes 124 are present. The local dimensional changes in the end regions of the stack are thus reduced.

Figure 18:
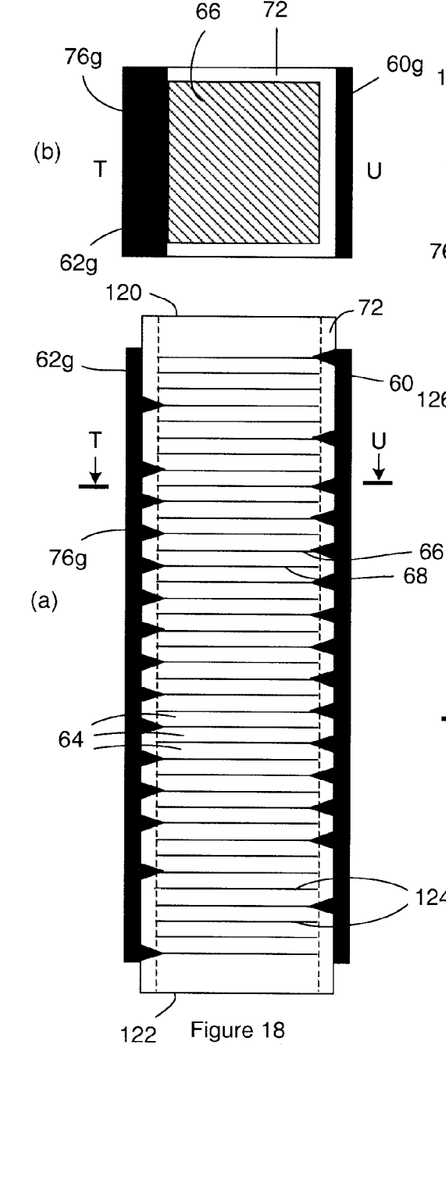

When the actuator is used in a fuel injector application, the actuator is held in position within the injector by mountings (not shown in FIG. 18) that are attached to the ends of the stack. By provision of the unconnected internal electrodes 124 and associated thicker piezoelectric layers, the stresses that develop as a result of the difference in strain between the stack and mountings are reduced.

Figure 19:
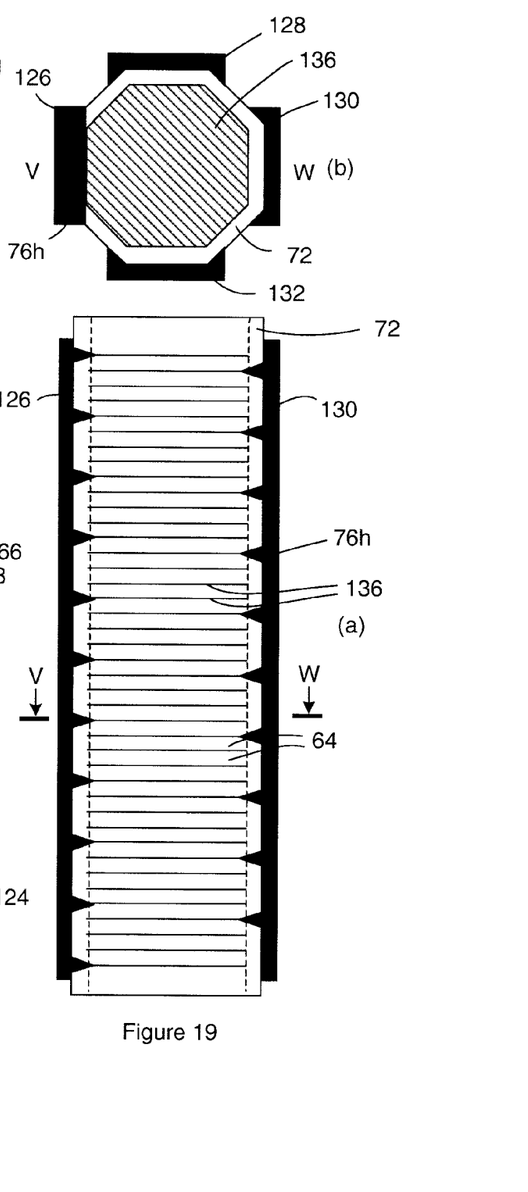

FIGS. 19(*a*) and 19(*b*) show an eighth embodiment of the present invention, comprising a piezoelectric actuator similar to that of the fourth embodiment, except in that, as shown most clearly in FIG. 19(*b*), the periphery of the stack has an octagonal cross section and defines eight rectangular faces containing axes parallel to the long axis of the actuator, and in that a side electrode 126, 128, 130, 132 is carried upon the insulating coating over each alternate rectangular face of the stack, so that four side electrodes 126, 128, 130, 132 are provided in total.

In this embodiment, an insulating coating 72 is carried on each rectangular face of the stack. 'v'-shaped slots 76*h* are provided in the insulating coating 72 carried on the faces of the stack associated with the four side electrodes 126, 128, 130, 132. On each such face, the slots 76*h* are arranged so that every fourth one of the internal electrodes 136 emerges at an internal surface of a respective slot. As the slots 76*h* are filled with the conductive material of the side electrodes 126, 128, 130, 132, each internal electrode 136 is in electrical connection with one of the side electrodes 126, 128, 130, 132.

The actuator of the eighth embodiment offers considerable flexibility in operation. For example, when used in a fuel injector application, two of the four side electrodes 126, 128, 130, 132 could be connected to a first power supply, and the remaining two of the four side electrodes 126, 128, 130, 132 could be connected to a second power supply. By independently controlling the voltage applied to each such pair of side electrodes through the first and second power supplies, the length of the stack could be digitally varied. Alternatively, one pair of side electrodes could be connected to a control device in order to transmit the signal generated by the stress imposed on the piezoelectric layers 64 associated with that side electrode, and hence an integral load sensor is incorporated into the stack.

Substantially any number of side electrodes could be provided, each communicating with a respective group of internal electrodes. The internal electrodes may be split into groups having unequal numbers of electrodes, and the electrodes of a given group may be dispersed along the stack or localised within a small region of the stack. The stack could be shaped to accommodate a side electrode on each alternate face, or alternatively, more than one side electrode could be provided on each face to communicate with slots formed across only part of the face.

A first method of constructing the actuator of the fourth embodiment (as shown in FIG. 14) is described with reference to FIG. 20. The method comprises coating the stack on its rectangular faces with the insulating coating 72, forming the slots 76*c* in the insulating coating 72 and the edge of the stack, then applying the side electrodes 60*c*, 62*c* to the insulating coating 72 and slots 76*c* on the positive and negative faces of the stack. The side electrodes 60*c*, 62*c* are applied by dispensing a conductive material onto the respective face of the assembly, so that the conductive material forming each side electrode 60*c*, 62*c* fills the respective slots 76*c* and forms a continuous layer on regions of the surface of the insulating coating 72.

Figure 21:
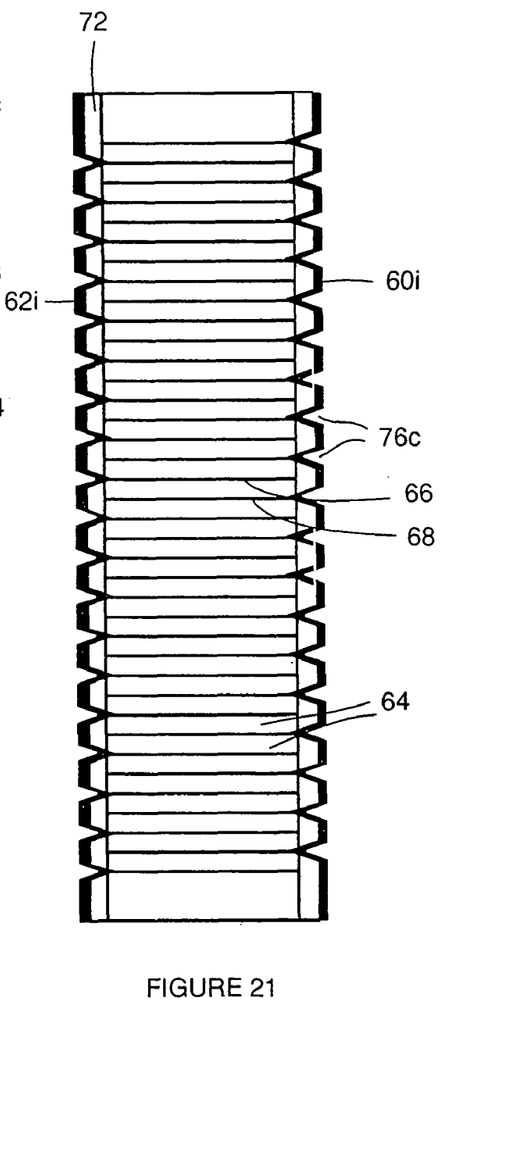
FIG. 21 is a sectional drawing of an actuator according to the present invention, to illustrate a second construction method.

A second method of constructing an actuator similar to that of the fourth embodiment, described with reference to FIG. 21, is similar to the first method of construction described above, except in that the side electrodes 60*i*, 62*i* are applied by depositing metal layers on the respective surfaces by evaporation, so that the conductive material forming each side electrode 60*i*, 62*i* forms a continuous coating on the inside surfaces of the respective slots 76*c* and regions of the surface of the insulating coating 72. The actuator formed by the second method of construction differs from that of the fourth embodiment in that the slots are not filled, but are only coated, with the conductive material.

It will be appreciated that several modifications lie within the inventive concept of the present invention. For example, the insulating means for the stack could be made from polymer, rubber, ceramic, glass or another material with low electrical permittivity and low electrical conductivity, and applied to the stack as a coating by painting, dipping, spraying or any other convenient method. Alternatively, the insulating means could be, for example, a heat-shrinkable tube attachable to the stack or an adhesive film of material. If the insulating means is made from a temperature resistant material, such as ceramic or glass, the insulating means could be applied to the stack before a heat treatment step, for example firing of the piezoelectric stack. The insulating means may be impermeable to fuel, water and/or other substances that are deleterious to the performance of the stack, therefore advantageously providing a barrier to prevent contact between such substances and the stack. In addition, the insulating means may augment the mechanical stability of the actuator, for example by preventing damage to the piezoelectric layers.

It will be apparent that the size and shape of the bridging means could be varied, the aforementioned embodiments being illustrative only of some possible variations. The previously defined first and second surfaces of the bridging means could have any convenient shape, providing that a cross-section through the surfaces broadly defines a mathematically continuous curve close to the piezoelectric/insulator interface. In other words, where the first and second surfaces intersect the plane of the piezoelectric/insulator interface, the surfaces share a common tangent.

The bridging means could be formed in any convenient way, for example by machine cutting or laser cutting to form slots. Alignment of the bridging means with the internal electrodes may, for example, be achieved by transmitted radiation methods, such as X-ray or infrared transmission. The midplane of a bridging means may be aligned or coplanar with the midplane of the respective internal electrode. However, some misalignment between a bridging means and the respective internal electrode is also possible, since no significant increase in field concentration is obtained if the midplane of a bridging means is misaligned with respect to the midplane of the internal electrode to which it is connected.

The bridging means need not be cut or machined slots, but could equally be provided by selectively applying an insulating coating, the bridging means being those regions left uncoated. Alternatively, the bridging means could be provided by selectively removing parts of a continuous insulating coating. Furthermore, bridging means filled with or containing the conductive material of the side electrodes could be realised by forming an assembly comprising an alternating sequence of insulating regions and conductive layers, the bridging means being defined by the boundaries of the insulating regions adjacent to the conductive layers. Such an assembly could, for example, be provided by modifying regions of the piezoelectric material at the edge of the piezoelectric stack so as to convert the piezoelectric material into insulating, low permittivity material in these regions.

In another arrangement, each bridging means is an internal electrode which extends through the insulating means. In this case, the bridging means comprise the material of the internal electrodes. The actuator otherwise has a construction similar to that shown in FIGS. 6 and 7. Conveniently, in this arrangement, the bridging means can be formed at the same time as the internal electrodes during manufacture of the actuator.

In yet another arrangement, each bridging means comprises an internal electrode which extends into the insulating means, and a slot which extends into the insulating means to intersect with or meet the internal electrode. In this embodiment, the intersection between the internal electrode and the slot lies within the insulating means. The slot may have a shape as previously described, and may be filled or coated with conductive material, such as the conductive material of the side electrode, so as to form an electrical connection between the internal electrode and the side electrode.

Figure 20:
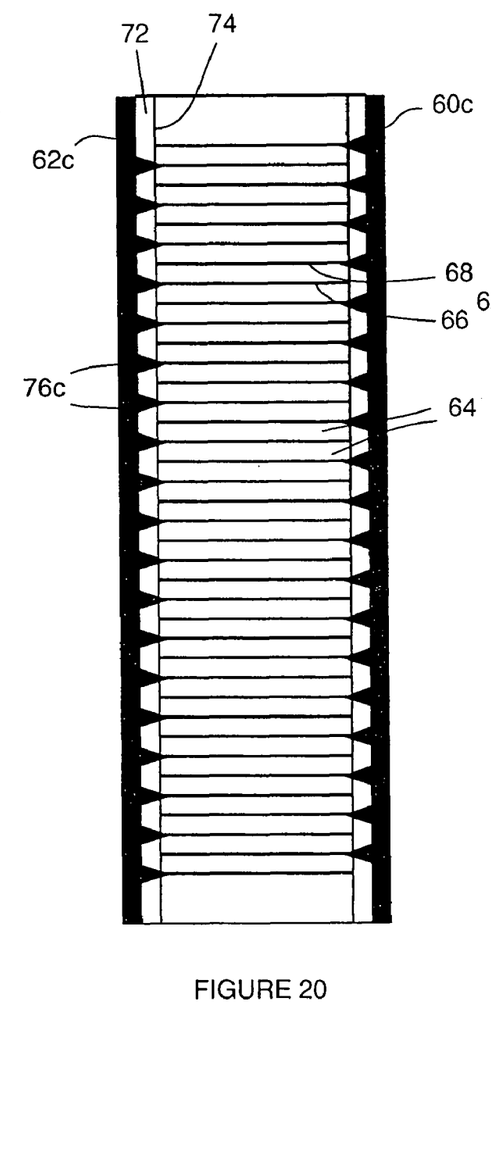
FIG. 20 is a sectional drawing of an actuator according to the present invention, to illustrate a first construction method.

The side electrodes could be made from a conductive material such as solder, conductive glue, metal loaded glaze or a metal film, and could be dispensed, soldered, brushed, screen-printed, rolled or otherwise applied to the stack in accordance with the first construction method of FIG. 20; or sputter-coated, evaporated, sprayed, plated (by electroless deposition or electroplating, for example) or otherwise applied to the stack in accordance with the second construction method of FIG. 21. Furthermore, other methods that provide a continuous coating of conductive material to define a conductive path between the slots of a face could be used to form the side electrodes.

The conductive material within the slots need not be the conductive material of the side electrodes. For example, the side electrodes may be made from a material other than the conductive material within the slots. Furthermore, the side electrodes may be formed in a different step and/or by a different method to that used to introduce the conductive material into the slots.

The invention claimed is:

1. A piezoelectric actuator comprising:
 a stack of piezoelectric layers formed from a piezoelectric material,
 a plurality of internal electrodes disposed throughout the stack to define active regions of the piezoelectric material therebetween that are responsive to a voltage applied across two or more groups of the internal electrodes in use,
 an insulating arrangement that at least partially covers at least one surface of the stack to define a piezoelectric/insulator interface, and
 two or more side electrodes to connect with the two or more groups of the internal electrodes;
 wherein a bridging arrangement extends through the insulating arrangement, the bridging arrangement comprising a conductive material so as to provide a connection between a side electrode and an internal electrode, and
 wherein at least one first surface, defined by an interface between the conductive material and the insulating arrangement, and at least one second surface, defined by an internal boundary of a piezoelectric layer, are substantially continuous with one another in the vicinity of the piezoelectric/insulator interface;
 wherein the internal boundary of a piezoelectric layer is defined by an interface between the piezoelectric material and the conductive material and wherein the first and second surfaces share a common tangent at the piezoelectric/insulator interface;
 characterized in that the bridging arrangement comprises a slot being a 'v' shaped groove.

2. The actuator of claim 1, wherein a midplane of the bridging arrangement is aligned with respect to a midplane of the internal electrode.

3. The actuator of claim 1, wherein a midplane of the bridging arrangement is misaligned with respect to a midplane of the internal electrode.

4. The actuator of claim 1, wherein the slot has a rounded internal end.

5. The actuator of claim 1, wherein the slot has a part-cylindrical internal end.

6. The actuator of claim 1, wherein the slot has a sharp internal end.

7. The actuator of claim 1, wherein the slot traverses the piezoelectric/insulator interface.

8. The actuator of claim 1, wherein the bridging arrangement further comprises an internal electrode that extends into the insulating arrangement and the slot intersects the internal electrode within the insulating arrangement.

9. The actuator of claim 1, wherein the conductive material of the side electrode coats the surface of the slot.

10. The actuator of claim 1, wherein the conductive material of the side electrode fills the slot.

11. The actuator of claim 1, wherein the bridging arrangement comprises an internal electrode that extends through the insulating arrangement.

12. The actuator of claim 1, wherein the shape of the bridging arrangement is complementary to the shape of the perimeter of the respective internal electrode.

* * * * *